United States Patent [19]

Picquendar

[11] 4,194,172
[45] Mar. 18, 1980

[54] APPARATUS FOR FILTERING AN ELECTRICAL SIGNAL WITH A CHARGE-COUPLED DEVICE

[75] Inventor: Jean-Edgar Picquendar, Paris, France

[73] Assignee: Thomson-CSF, Paris, France

[21] Appl. No.: 887,340

[22] Filed: Mar. 16, 1978

[30] Foreign Application Priority Data

Mar. 29, 1977 [FR] France ................................ 77 09294

[51] Int. Cl.$^2$ ...................... H03H 7/10; H03H 7/28; H03K 5/156; G11C 19/28
[52] U.S. Cl. ............................... 333/165; 307/221 D; 364/862; 333/166
[58] Field of Search ................. 333/70 T, 70 R, 70 A, 333/165, 166, 173; 328/167; 307/221 D, 295; 364/824, 825, 826, 827, 862; 357/24

[56] References Cited

U.S. PATENT DOCUMENTS

| | | | |
|---|---|---|---|
| 3,971,998 | 7/1976 | Gopinath et al. | 307/295 X |
| 4,031,490 | 7/1977 | Copeland | 333/70 T |
| 4,063,200 | 12/1977 | Mattern | 333/70 A |

Primary Examiner—Alfred E. Smith
Assistant Examiner—Marvin Nussbaum
Attorney, Agent, or Firm—Cushman, Darby & Cushman

[57] ABSTRACT

A filter comprising a charge-coupled device having a first group of cells weighted according to a recurring filter law and having a second group of cells weighted according to a non recurring filter law. The cells of the first and second groups are interposed alternately and the displacement of the charges under these cells is carried at frequency twice that of the sampling rate of the input signal. Thus the effects of transfer inefficiency are suppressed without added hardware.

4 Claims, 2 Drawing Figures

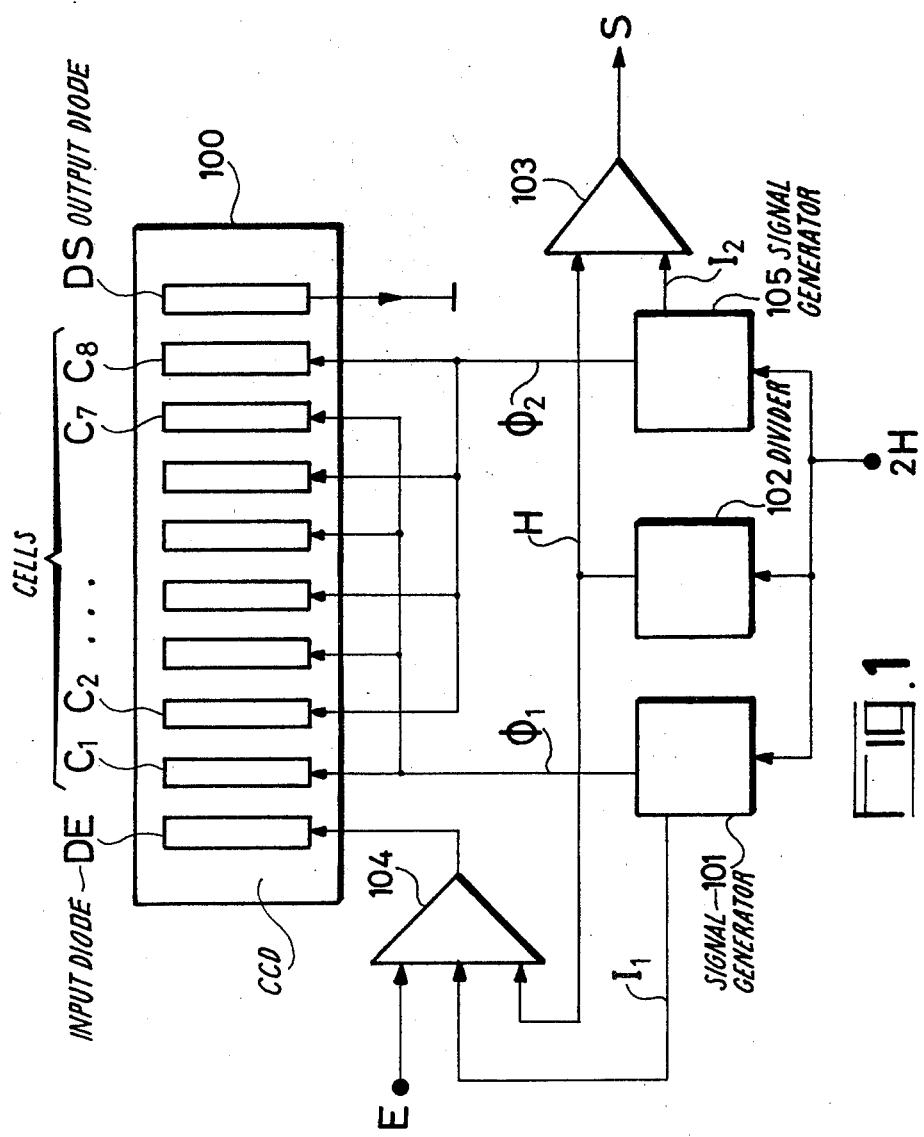

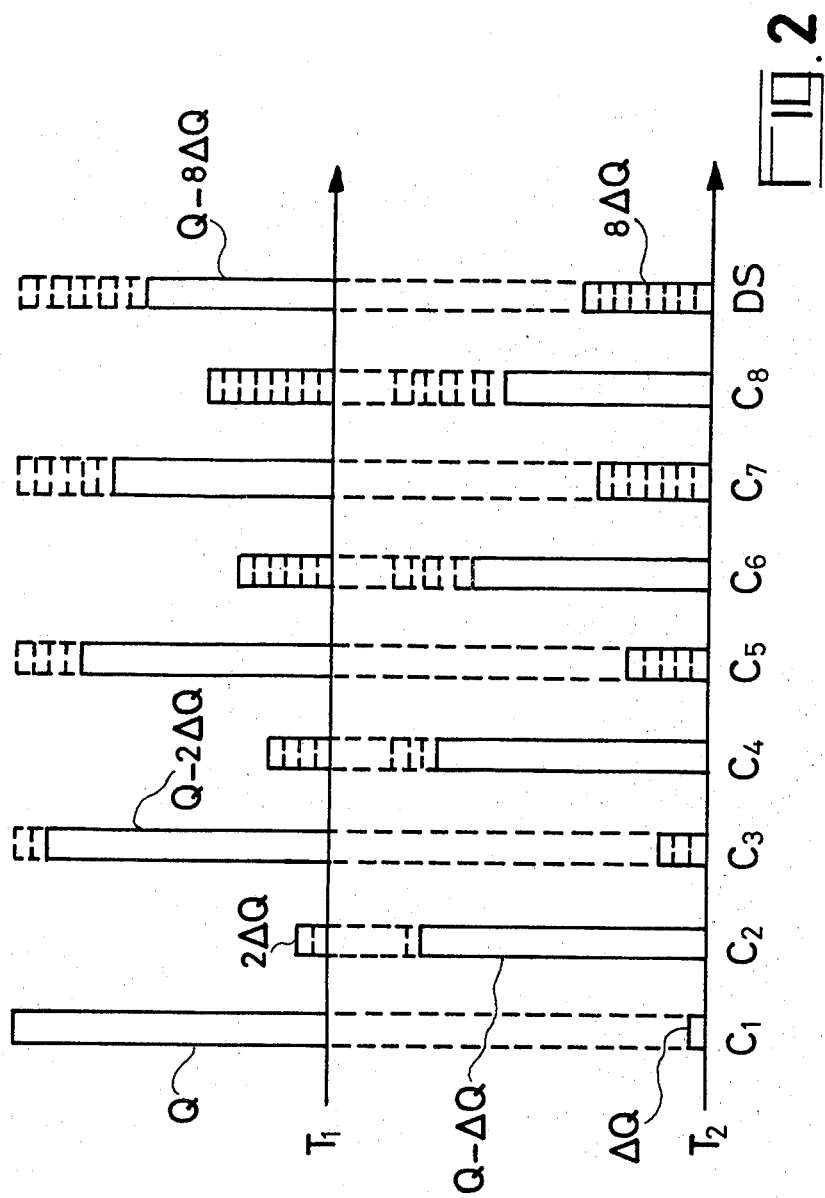

APPARATUS FOR FILTERING AN ELECTRICAL SIGNAL WITH A CHARGE-COUPLED DEVICE

The present invention relates to filters employing a charge-coupled device (CCD). These filters are similar to digital filters since they employ a sampling process, but they differ from digital filters in that the samples employed are not digitized. This similarity permits the use of the methods of synthesis employed in the calculation of digital filters. Such filters are of particular utility in time division exchanges.

It is known to manufacture such filters and there is a description thereof in the article "Transversal Filtering using Charge-transfer Devices" published by Dennis D. BUSS et al. in volume SC8, No 2 of April 1973 of the review "IEEE Journal of Solid-State Circuits".

The charge-coupled devices employed in these filters are also known. A detailed description thereof is found in the article Charged-Coupled Devices published by Gilbert F. AMELIO in volume 230 No 2 of February 1974 of the review "Scientific American".

All these devices have the defect termed transfer inefficiency which is manifested by a progressive depletion of the charge moved as it progresses in the CCD. It has been possible to obtain an inefficiency as low as 1/10,000th, but in the case of a recurrent filter where the signal travels through the CCD a great number (as a rule infinite) of times such an inefficiency is troublesome owing to its cumulative effect.

U.S. Patent application No. 855,695 filed on Nov. 29, 1977 and now abandoned discloses a method whereby it is possible to overcome the drawbacks due to this defect by employing a clock frequency which is a multiple of the base frequency. Further, when this method is employed directly in a CCD filter only every other cell of the CCD is employed, which requires for a given performance a CCD which is twice as large.

In accordance with the present invention, there is provided an apparatus for filtering an input signal, which comprises:

a charge-coupled device having an input diode for receiving said input signal, an output earthed diode, a first plurality of cells weighted according to a recurring filter law, and a second plurality of cells weighted according to a non recurring filter law; the cells of said first plurality being interposed one-by-one between the cells of said second plurality;

a first generator for applying to the cells of said first plurality a first set of displacement signals having a clock frequency, and integrating the displacement signals of said first set for applying to said input diode a recurring feed-back signal; and a second generator for applying to the cells of said second plurality a second set of displacement signals having sais clock frequency, and integrating the displacement signals of said second set for delivering an output filtered signal.

For a better understanding of the invention, and to show how the same may be carried into effect, reference will be made to the ensuing description and to the attached figures among which:

FIG. 1 illustrates the diagram of a filter according to the invention;

FIG. 2 illustrates a particular representation of the charges circulating in the CCD of such a filter.

The filter illustrated in FIG. 1 is of the hybrid recurring and monrecurring type which signifies that a part of its coefficients corresponds to zeros and therefore to elements directly connected to the output, and the other part of its coefficients to poles therefore to elements feed-back connected to the input. For convenience of the description, the number of elements of the recurring part has been chosen to be equal to the number of elements of the nonrecurring part. The whole of the apparatus comprises a CCD 100, two signal generators 101 and 105, a divider 102 and two amplifiers 103 and 104.

The CCD 100 comprises 8 cells, $C_1$ to $C_8$, an input diode DE and an output diode DS. The cells C, represented by a simple rectangle in the Fig., comprises in the conventional manner two or three electrodes in accordance with the technology used (two phases or three phases). These cells receive control signals through connection $\phi_1$ for the cells of the uneven series $C_1$ to $C_7$ and $\phi_2$ connections for the cells of the even series $C_2$ to $C_8$, from the signal generators 101 and 105. Here again, the connections $\phi_1$ and $\phi_2$ have been shown single whereas they comprise a plurality of connections per cell in accordance with the number of phases of the CCD. These control signals have a well-defined form and are produced by the generators 101 and 105 from a clock signal 2H in a conventional manner.

The electric charges to be transferred from the input to the output are injected into the CCD by means of the input diode DE, they move under the cells $C_1$ to $C_8$ at the rhythm of the clock signals 2H and are dissipated in the output diode DS which is earthed. Indeed, in this application, it is the passage of these charges under the cells $C_1$ to $C_8$ which gives the useful signals.

The signal E to be filtered is applied to the input of the amplifier 104. This amplifier effects a sampling under the action of the clock signal H which varies the gain between 0 and a fixed value which permits injection through the diode DE. These signals H are of a frequency which is one half of the signals 2H and are obtained from the latter by a division by 2 in the divider 102. This divider is adjusted to deliver the signals H with a suitable phase so that the charges, injected through the diode DE, are transferred under the first electrode of $C_1$ by the signals applied to the latter through the connections $\phi_1$. Owing to the fact that the signal H is of a frequency one half of the signal 2H, the diode DE injects a zero charge every other time and there is along the CCD constantly a succession of effective charges which are each separated by a zero charge.

In order to better explain the improvements brought by the operation with a clock frequency double the frequency 2H, there have been shown in FIG. 2 in a qualitative and exaggerated manner for reasons of clarity of the drawing, the charges under the cells $C_1$ to $C_8$ and that which is dissipated in the diode DS at the end of two successive times $T_1$ and $T_2$ of the clock 2H, in a theoretical case taken for the purposes of explanation in which there is injected through the diode DE a constant charge Q at each uneven time ($T_1$ in particular) and, as seen hereinbefore, a zero charge at each even time ($T_2$ in particular). These times $T_1$ and $T_2$ are selected in a succession of times beginning at a former time $T_{-n}$ and ending at a latter time $T_m$.

At the end of $T_1$, the diode DE has injected under the cell $C_1$ a charge Q. This charge Q is transferred under the cell $C_2$ during the time $T_2$, but owing to the transfer inefficiency at the end of this time $T_2$, there remains under the cell $C_1$ a charge $\Delta Q$ and consequently there is under the cell $C_2$ only the charge $Q-\Delta Q$.

As it has been assumed that there have been injected from time T-7 constant charges equal to Q all the uneven times, there is under $C_3$ at the end of the next time $T_3$ a charge Q-2ΔQ. Indeed, as the transfer inefficiency is low in present CCDs its cumulative effect on the charge transferred is of the form $(1-\epsilon)^n$ which is substantially equal to 1-nε. Moreover, as the charge non-transferred owing to this transfer inefficiency is transferred at the following clock time with the same inefficiency, it only leaves a residue of the second order of $\epsilon^2$ which is added to the charge at 1-nε arriving under the cell where this residue stays and therefore does not change the order of magnitude of the arriving charge. In fact, at each clock time, the effective charges transferred decrease by ΔQ. Correspondingly, the noneffective charge which come from this decrease also undergo the transfer, but with a delay of a clock time, and increase by ΔQ at each time. Thus, at the end of $T_1$, there is a charge of 2ΔQ under $C_2$ and, at the end of $T_2$, Q charge of ΔQ under $C_1$.

On the other hand, while at the end of time $T_1$ a charge Q-8ΔQ flows in the diode DS, a charge 8ΔQ flows there at the end of time $T_2$, since there is no accumulation in this diode of a nontransferred charge. This is moreover normal since the charge issuing from the CCD at the end of the two clock times must be the same as that which entered it, namely Q.

It is important to note that four useful charges are permanently in the CCD. These charges are in the described example under the four uneven cells $C_1$, $C_3$, $C_5$, $C_7$ at the end of uneven times and under the four even cells $C_2$, $C_4$, $C_6$, $C_8$ at the end of the even times.

This then permits allocative to the group of four uneven cells the coefficients of the recurring part of the filter and to the group of the four even cells the coefficients of the nonrecurring part, or vice versa. In this way all the cells will be employed and although the method of the double clock frequency is employed, there will be no loss in the CCD. However, this presupposes that there are as many coefficients in the recurring part as in the nonrecurring part, which most often does not present problems in respect of the synthesis of this filter. In particular cases, the dimensions of the CCD will be determined in accordance with the longest part (recurring or nonrecurring) and there will be in any case a considerable saving.

There will then be an offset of a time of the clock 2H (namely a half-time of the clock H) which will have to be introduced in the transfer function which affects the calculation of the coefficients but presents no particular difficulty in the synthesis of the filter since this only corresponds to a numerical coefficient.

In the example described, the displacement signals of the uneven group are applied through the connections $\phi_1$ by the generator 101 and the displacement signals of the even group are applied through connections $\phi_2$ by the generator 105 although these signals are identical (in voltage) and in phase (since they are of frequency 2H).

Indeed, there has been employed here for weighting the cells, the conventional technique of split electrodes which is manifested by a modification of the currents which flow through the connections $\phi_1$ and $\phi_2$. In this technique, an integration of these currents has to be effected this integration ocurring in an advantageous manner in the generators 101 and 105 each of which comprises an integrator.

The output of the integrator contained in the generator 101 is by way of the connection $I_1$ which is connected to an input of the amplifier 104. Indeed, the generator 101 is connected to the uneven group which corresponds to the recurring part of the filter and this feed-back connection of $I_1$ to the diode DE through the amplifier 104 in fact corresponds to this characteristic of recurrence.

The output of the integrator contained in the generator 105 is through the connection $I_2$ which is connected to the output S through the amplifier 103. This amplifier 103 receives also the clock H which controls its gain between a zero value and a fixed value in accordance with the desired output level. In this way it is possible to allow through only the signals corresponding to the useful charges when the latter arrive under the even cells. Indeed, when the residual charges due to the transfer inefficiency arrive under the even cells and therfore give rise to a parasite signal on the output $I_2$, the gain of the amplifier 103 is null and the parasite signal disappears.

As the even group corresponds to the nonrecurring part of the filter, the signal at S therefore corresponds to the filtering of the signal at E by this nonrecurring part and also by the recurring part, the connection between these two parts being achieved in an intrinsic manner by the action of the charges on the uneven cells.

There has thus been obtained a recurring and nonrecurring filter which employs a CCD and in which the drawbacks due to the transfer inefficiency in this CCD have been overcome without increasing the size.

Such filters may be advantageously employed in exchanges of the time division type, in which the signals to be filtered are to be sampled at a frequency which could very well be that of the clock employed for the filter. The gain as concerns the size of the filter is then of particular interest owing to the large number of filters employed.

What I claim is:

1. An apparatus for filtering an input signal, comprising:
    a charged-coupled device having an input diode for receiving said input signal, a grounded output diode, a first plurality of cells weighted so as to represent a recurring filter law, and a second plurality of cells weighted so as to represent a nonrecurring filter law; the cells of said first plurality being interposed one-by-one between the cells of said second plurality;
    a first generator for applying to the cells of said first plurality a first set of displacement signals having a predetermined clock rate, and for obtaining from said first set of displacement signals a recurring feedback signal for coupling to said input diode; and
    a second generator for applying to the cells of said second plurality a second set of displacement signals having said clock frequency, and for obtaining from said second set of displacement signals an output filtered signal.

2. An apparatus according to claim 1, further comprising means for simultaneously adding and sampling at a second predetermined clock rate that is one-half the frequency of said clock rate said input signal and said recurring feed-back signal; said adding and sampling means coupling input samples to said input diode.

3. An apparatus according to claim 2, wherein two successive of said samples are separated by a null signal.

4. An apparatus according to claim 3, further comprising means for sampling the output filtered signal at said second predetermined clock rate, and blocking the delivering of said output filtered signal when the cells of said second plurality are excited by null signals.

* * * * *